United States Patent
Chen (10) Patent No.: US 8,019,307 B2
(45) Date of Patent: *Sep. 13, 2011

(54) METHOD AND RELATED ELECTRONIC DEVICE FOR ADJUSTMENT OF A RADIO FREQUENCY CIRCUIT BY IMPEDANCE LOADING FEATURES

(75) Inventor: Yung-Jinn Chen, Taipei Hsien (TW)

(73) Assignee: Winstron NeWeb Corporation, Hsi-Chih, Taipei Hsien (TW)

( * ) Notice: Subject to any disclaimer, the term of this patent is extended or adjusted under 35 U.S.C. 154(b) by 807 days.

This patent is subject to a terminal disclaimer.

(21) Appl. No.: 12/049,381

(22) Filed: Mar. 17, 2008

(65) Prior Publication Data

US 2009/0146891 A1  Jun. 11, 2009

(30) Foreign Application Priority Data

Dec. 5, 2007  (TW) ............................... 96146318 A (51) Int. Cl.
*H04B 1/18* (2006.01)

(52) U.S. Cl. ............ 455/280; 455/550.1; 343/861
(58) Field of Classification Search ............ 455/107, 455/129, 193.1, 193.2, 280, 550.1; 343/860, 343/861
See application file for complete search history.

(56) References Cited

U.S. PATENT DOCUMENTS

2009/0179807 A1 * 7/2009 Peng ........................ 343/749
* cited by examiner

*Primary Examiner* — Nhan Le
(74) *Attorney, Agent, or Firm* — Winston Hsu; Scott Margo (57) ABSTRACT

A method for adjustment of a radio-frequency circuit by impedance loading features includes designing a plurality of test fixtures each corresponding to an impedance loading area according to a predefined operating frequency band, coupling each of the plurality of test fixtures to a test point of the radio-frequency circuit for measuring a plurality of radio-frequency characteristic sets, determining an optimal impedance loading area of the radio-frequency circuit according to the plurality of radio-frequency characteristic sets, and adjusting the radio-frequency circuit according to the optimal impedance loading area.

22 Claims, 10 Drawing Sheets

A1: 880.00000MHz / 56.753 Ω / 58.631 Ω / 10.604 nH
A2: 915.00000MHz / 73.434 Ω / -2.2241 Ω / 78.205 pF
A3: 960.00000MHz / 21.448 Ω / 6.3501 Ω / 1.0528 nH
A4: 1.7100000GHz / 18.884 Ω / 1.7986 Ω / 167.40 pH
A5: 1.7938190GHz / 51.126 Ω / 9.9347 Ω / 881.45 pH
A6: 1.8821192GHz / 26.995 Ω / -7.8874 Ω / 10.721 pF
A7: 1.9100000GHz / 24.024 Ω / -660.12 m Ω / 126.23 pF
A8: 1.9900000GHz / 36.248 Ω / 13.105 Ω / 1.0481 nH

A1 : 880.00000MHz / 42.874 Ω / 20.262 Ω / 3.6645nH
A2 : 915.00000MHz / 26.253 Ω / 8.9027 Ω / 1.5485nH
A3 : 960.00000MHz / 17.280 Ω / 1.6588 Ω / 2.7501nH
A4 : 1.7100000GHz / 57.782 Ω / 2.0486 Ω / 190.67pH
A5 : 1.8050000GHz / 80.586 Ω / 41.127 Ω / 3.6264nH
A6 : 1.8800000GHz / 115.97 Ω / 10.031 Ω / 849.17pH
A7 : 1.9100000GHz / 98.270 Ω / -7.3373 Ω / 11.357pF
A8 : 1.9900000GHz / 73.420 Ω / 9.7603 Ω / 780.60pH

METHOD AND RELATED ELECTRONIC DEVICE FOR ADJUSTMENT OF A RADIO FREQUENCY CIRCUIT BY IMPEDANCE LOADING FEATURES

BACKGROUND OF THE INVENTION

1. Field of the Invention

The present invention relates to a method and a related electronic device for adjustment of a radio-frequency circuit by impedance loading features, more particularly, to a method and a related electronic device for reducing the amount of time and resources needed for designing the radio-frequency circuit.

2. Description of the Prior Art

The transmitting and receiving abilities of the radio frequency in the wireless communication device determine the communication quality of the wireless communication system. If the transmit signal power of the wireless communication device does not work well, it will affect the signal receiving quality of the base station; on the contrary, if the receiving sensitivity of the wireless communication device does not work well, it will affect the receiving efficiency of the wireless communication. In other words, once a problem appears in one of the Uplink and the Downlink, it will greatly influence overall communication quality, even lead to a communication disconnection. Therefore, the transmitting and receiving abilities of the radio-frequency circuit are considered when designing wireless communication devices in order to achieve the communication quality required.

Figure 1:
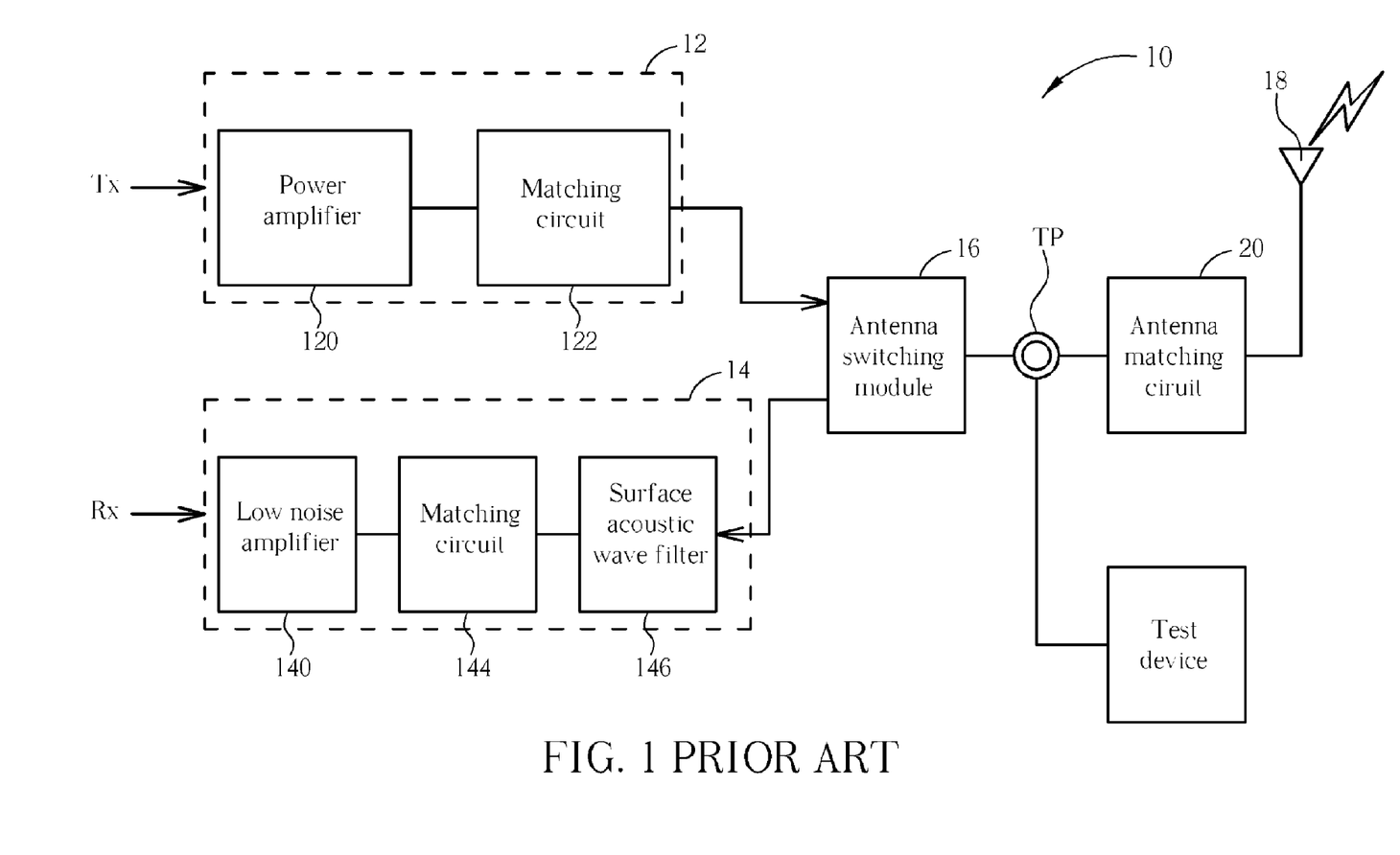
FIG. 1 is a diagram illustrating a radio-frequency circuit conventionally used on a wireless communication device.

Please refer to FIG. 1. FIG. 1 is a diagram illustrating a radio-frequency circuit 10, which is conventionally used on a wireless communication device. Radio-frequency circuit 10 comprises a radio-frequency transmitting module 12, a radio-frequency receiving module 14, an antenna switching module 16, an antenna 18, and an antenna matching circuit 20. Radio-frequency transmitting module 12 comprises a power amplifier 120 and a matching circuit 122 to enhance the signal power outputted from a radio-frequency signal processing unit for transmitting the signal into the air through antenna 18. Radio-frequency receiving module 14 comprises a low noise amplifier 140, a matching circuit 144, and a surface acoustic wave filter (SAW filter) 146 to receive wireless signal through antenna 18, and to transmit the received signal to the radio-frequency signal processing unit for demodulating or decoding, etc. Generally, a test point TP is used as boundary while designing radio-frequency circuit 10. First, the test point TP is connected to a test device, the characteristics of radio-frequency transmitting module 12 and radio-frequency receiving module 14 are adjusted under the condition that impedance is 50Ω to fit in with the design specification. Next, antenna 18 that is installed in radio-frequency circuit 10 is measured from test point TP by a network analyzer for adjustment of the shape of antenna 18 and the characteristics of antenna matching circuit 20 to attain the optimal standing wave ratio or reflection coefficient.

Figure 2:
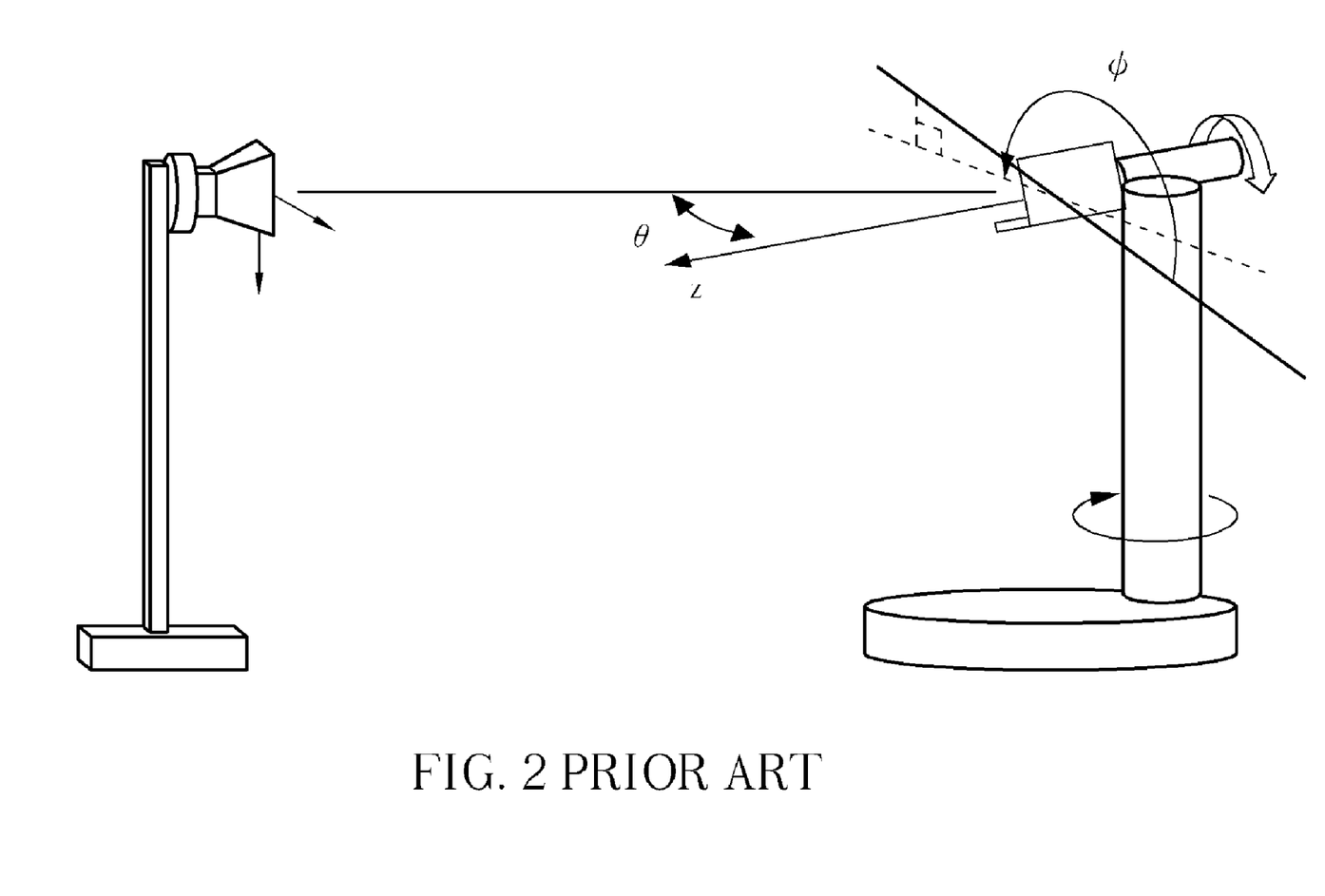
FIG. 2 is a diagram illustrating the total radiated power and total isotropic sensitivity conventionally tested.

After the design of radio-frequency circuit 10 is completed, a wireless communication device installed with radio-frequency circuit 10 is placed in the three-dimensional microwave anechoic chamber for testing total radiation power (TRP) and total isotropic sensitivity (TIS), as shown in FIG. 2. TRP and TIS are used to evaluate the transmitting and receiving abilities of the wireless communication device, correlative illustration is described as follows.

TRP is the average value of outwardly radiated power of transmitter in the wireless communication device in omni directional space; it is to overall estimate the transmitting ability of a transmitter in the wireless communication device in three-dimensional space. The testing method of TRP is: set up the wireless communication device to the three-dimensional microwave anechoic chamber as shown in FIG. 2, estimate the effective isotropic radiated power (EIRP) respectively at each 15 degree interval between the θ-axis and φ-axis on a spherical coordinate system by controlling the location of the wireless communication device, and by carrying out the integral operation on all estimated results, TRP therefore can be obtained.

On the other hand, TIS is the receiving sensitivity of the receiver in the wireless communication device in omni directional space; it is to overall estimate the receiving ability of transmitter in the wireless communication device. The testing method of TIS is: estimate the effective isotropic sensitivity (EIS) respectively at each 30 degree interval between the θ-axis and φ-axis on a spherical coordinate system by controlling the location of the wireless communication device, and by carrying out the integral operation on all estimated results, TIS therefore can be obtained.

Thus after the design of the radio-frequency circuit 10 (not shown in FIG. 1 ) is completed, the TRP and the TIS of the wireless communication device are estimated in the three-dimensional microwave anechoic chamber to evaluate the transmitting and receiving abilities of the wireless communication device. After that, the designers may re-adjust the radio-frequency circuit 10 (not shown in FIG. 1) according to the estimated TRP and TIS in order to obtain the highest TRP and the lowest TIS conforming to the communication specification. Such designing process, however, takes too much time and resources; and the optimal TRP and TIS may not be obtained with limited time and resource.

Figure 3:
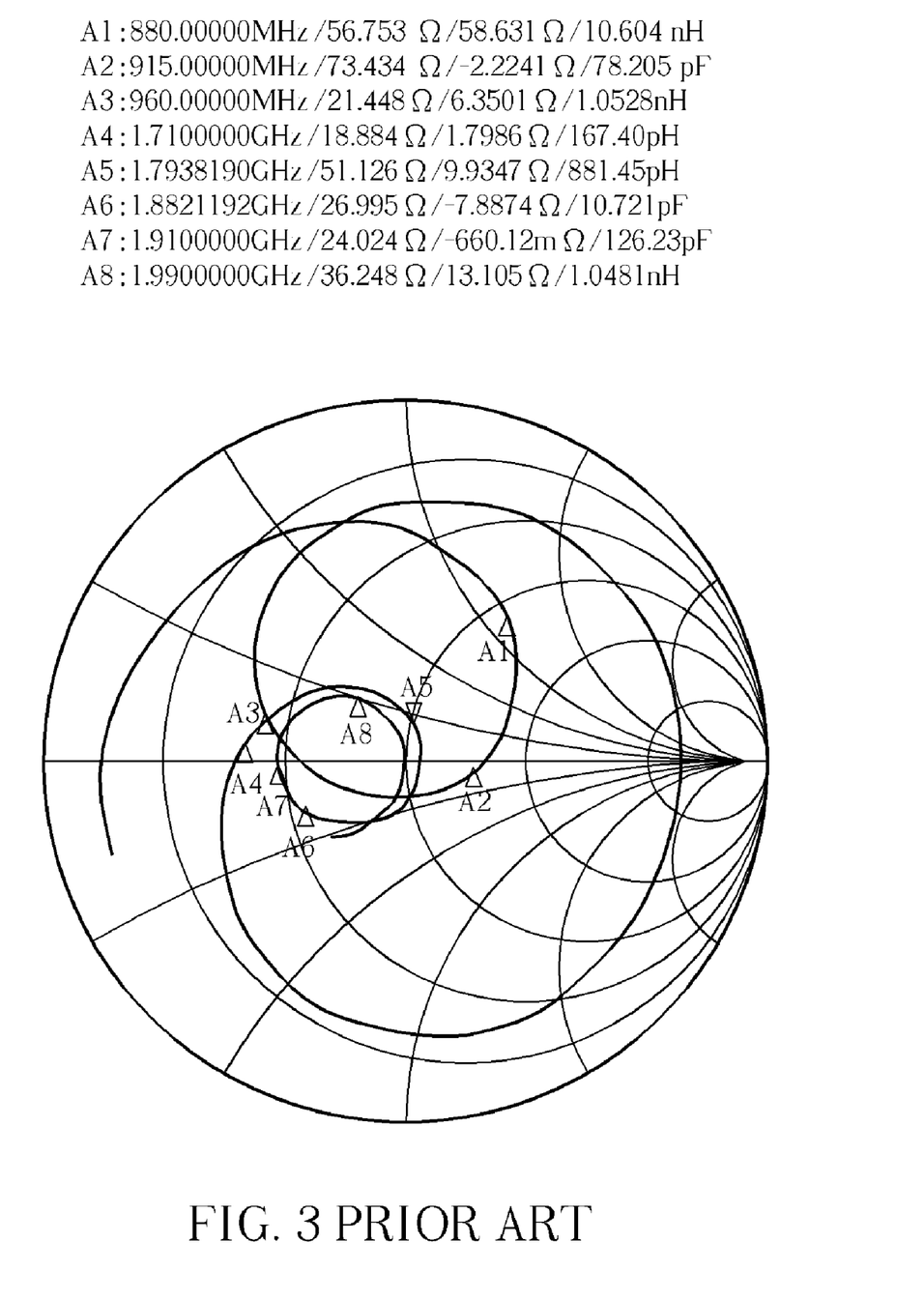
FIG. 3 is the Smith Chart of a GSM triple-band antenna.
Figure 4:
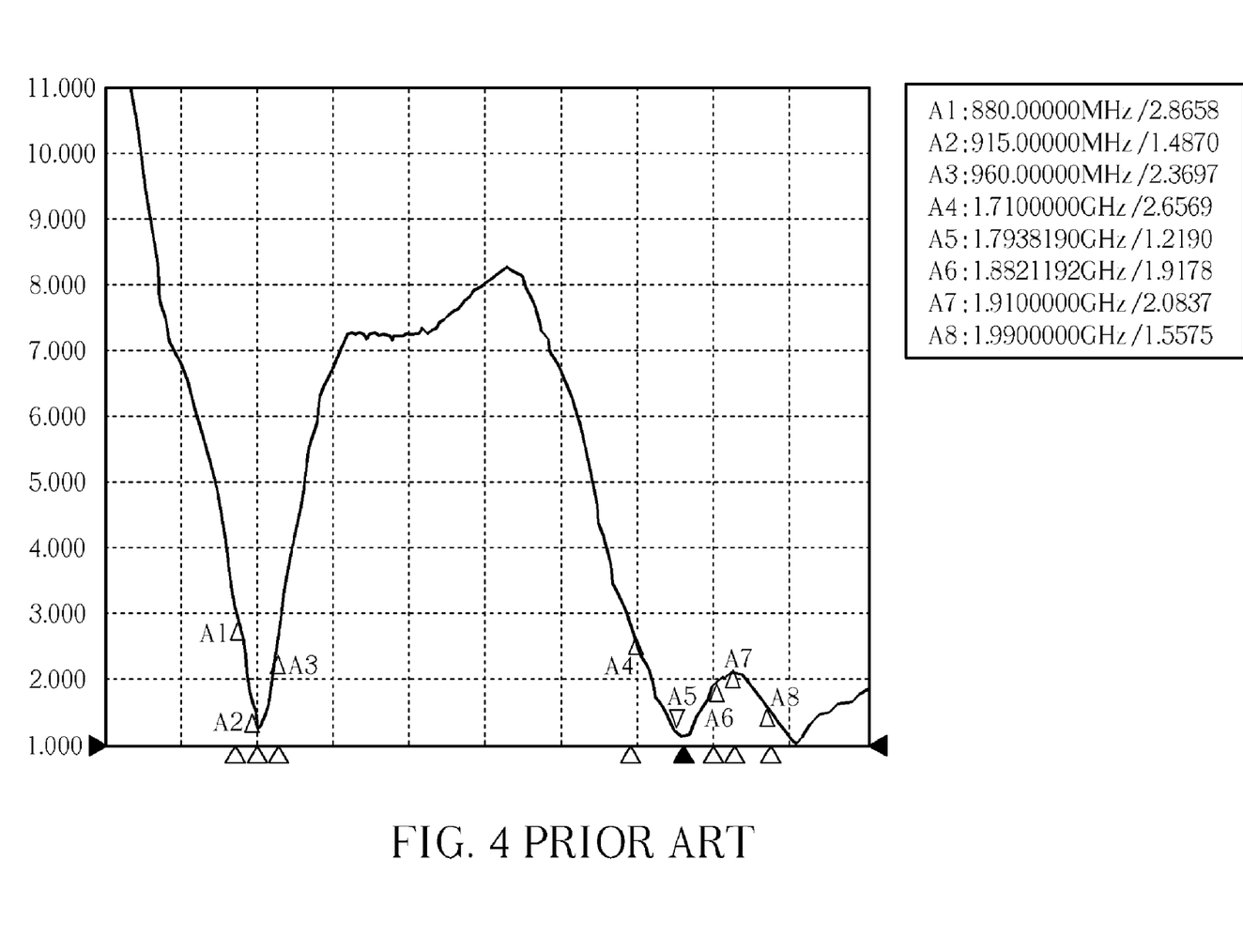
FIG. 4 is a diagram illustrating the voltage standing wave ratio (VSWR) of a GSM triple-band antenna.
Figure 5:
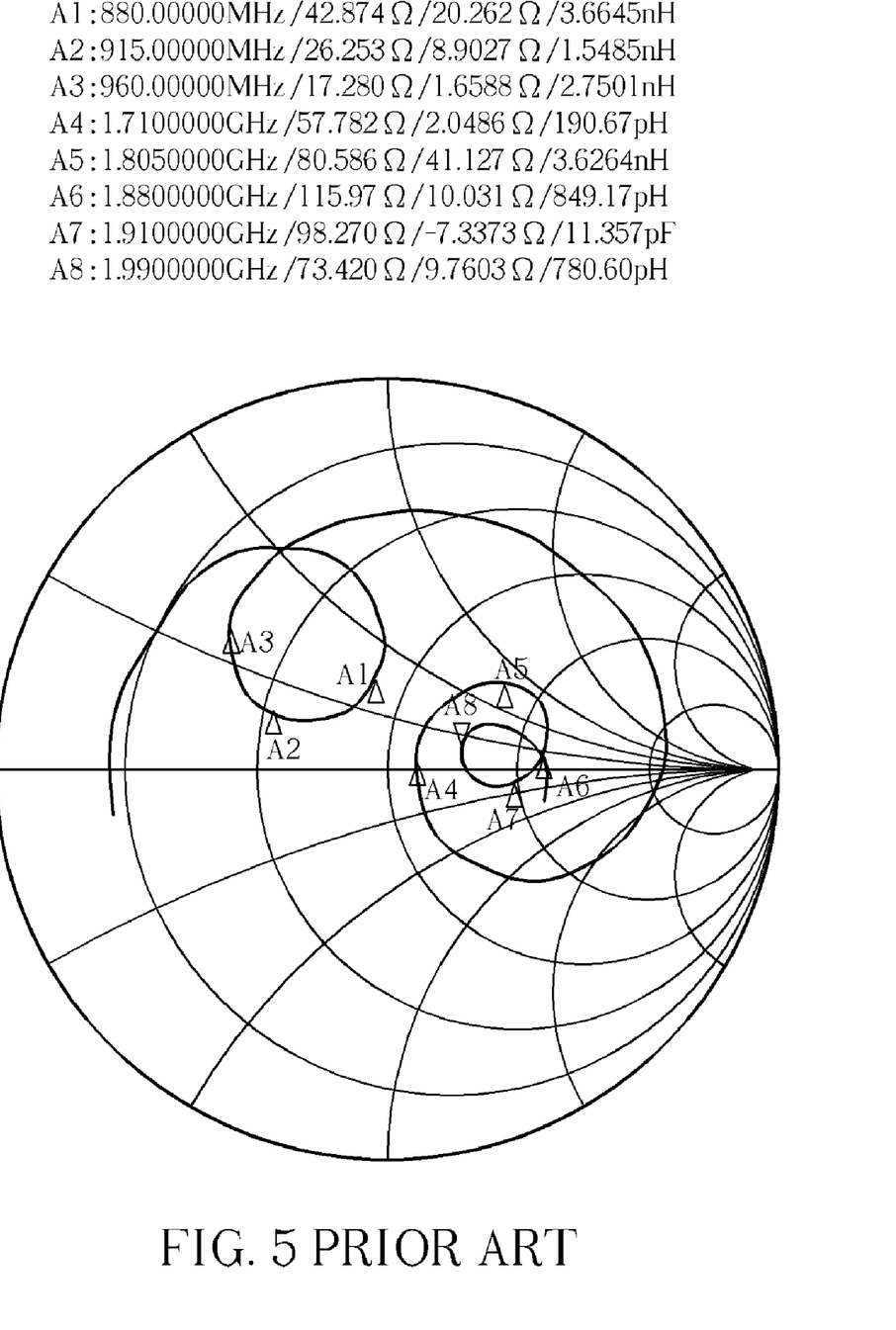
FIG. 5 is the Smith Chart of another GSM triple-band antenna.
Figure 6:
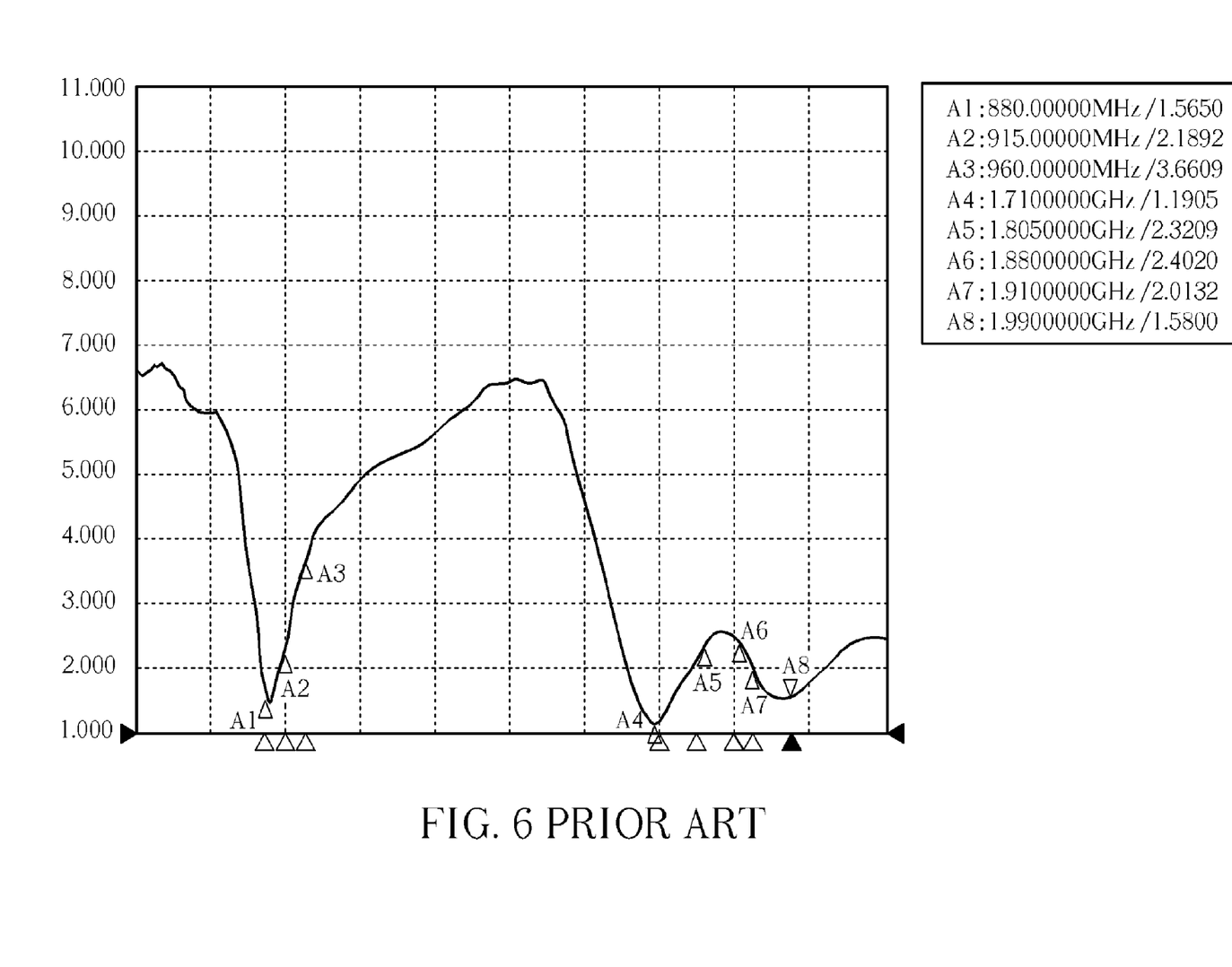
FIG. 6 is a diagram illustrating the VSWR of another GSM triple-band antenna.

As described above, a designer of the wireless communication device usually assumes the impedance of all frequency bands is 50Ω. In fact, in order to reduce the size of antenna and to conform to the requirements of multi-frequency bands, it is difficult for the impedance of antenna with a matching circuit to approach 50Ω; therefore designing becomes more difficult. Referring to FIGS. 3 to 6, for example, FIGS. 3 and 4 are diagrams illustrating the Smith Chart and the voltage standing wave ratio (VSWR) of a GSM triple-band antenna; FIGS. 5 and 6 are diagrams illustrating the Smith Chart and the VSWR of another GSM triple-band antenna. A corresponding communication system to the triple band as described above is: EGSM900 system, in which the receiving frequency band is between 925.2 MHz and 959.8 MHz and the transmitting frequency band is between 880.2 MHz and 914.8 MHz; DCS1800 system, in which the receiving frequency band is between 1805.2 MHz and 1879.8 MHz and the transmitting frequency band is between 1710.2 MHz and 1784.8 MHz; PCS1900 system, in which the receiving frequency band is between 1930 MHz and 1990 MHz and the transmitting frequency band is between 1850 MHz and 1910 MHz.

In FIGS. 3 and 5, it is difficult for all three frequency bands of the GSM triple-band antenna to meet the requirement of approaching 50Ω of impedance, this is why the designers are incapable of knowing with which antenna and its matching circuit the active radiation feature of the wireless communication device is able to perform best.

SUMMARY OF THE INVENTION

The present invention provides a method and a related electronic device for adjustment of a radio-frequency circuit by impedance loading features to reduce the amount of time and resources needed for designing the radio-frequency circuit.

The present invention discloses a method for adjustment of a radio-frequency circuit by impedance loading features, comprising: designing a plurality of test fixtures each corresponding to an impedance loading area according to a predefined operating frequency band; coupling each of the plurality of test fixtures to a test point of the radio-frequency circuit for measuring a plurality of radio-frequency characteristic sets; determining an optimal impedance loading area of the radio-frequency circuit according to the plurality of radio-frequency characteristic sets; and adjusting the radio-frequency circuit according to the optimal impedance loading area.

The present invention further discloses an electronic device for adjustment of a radio-frequency circuit by impedance loading features, comprising: a plurality of test fixtures each corresponding to an impedance loading area of a predefined operating frequency band; a test device coupled to a test point of the radio-frequency circuit through one of the plurality of test fixtures for measuring plurality of radio-frequency characteristic sets of the radio-frequency circuit by the plurality of test fixtures; and a determination device coupled to the test device for determining an optimal impedance loading area of the radio-frequency circuit according to the plurality of the radio-frequency characteristic sets in order to provide a basis for adjustment of the radio-frequency circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 7:
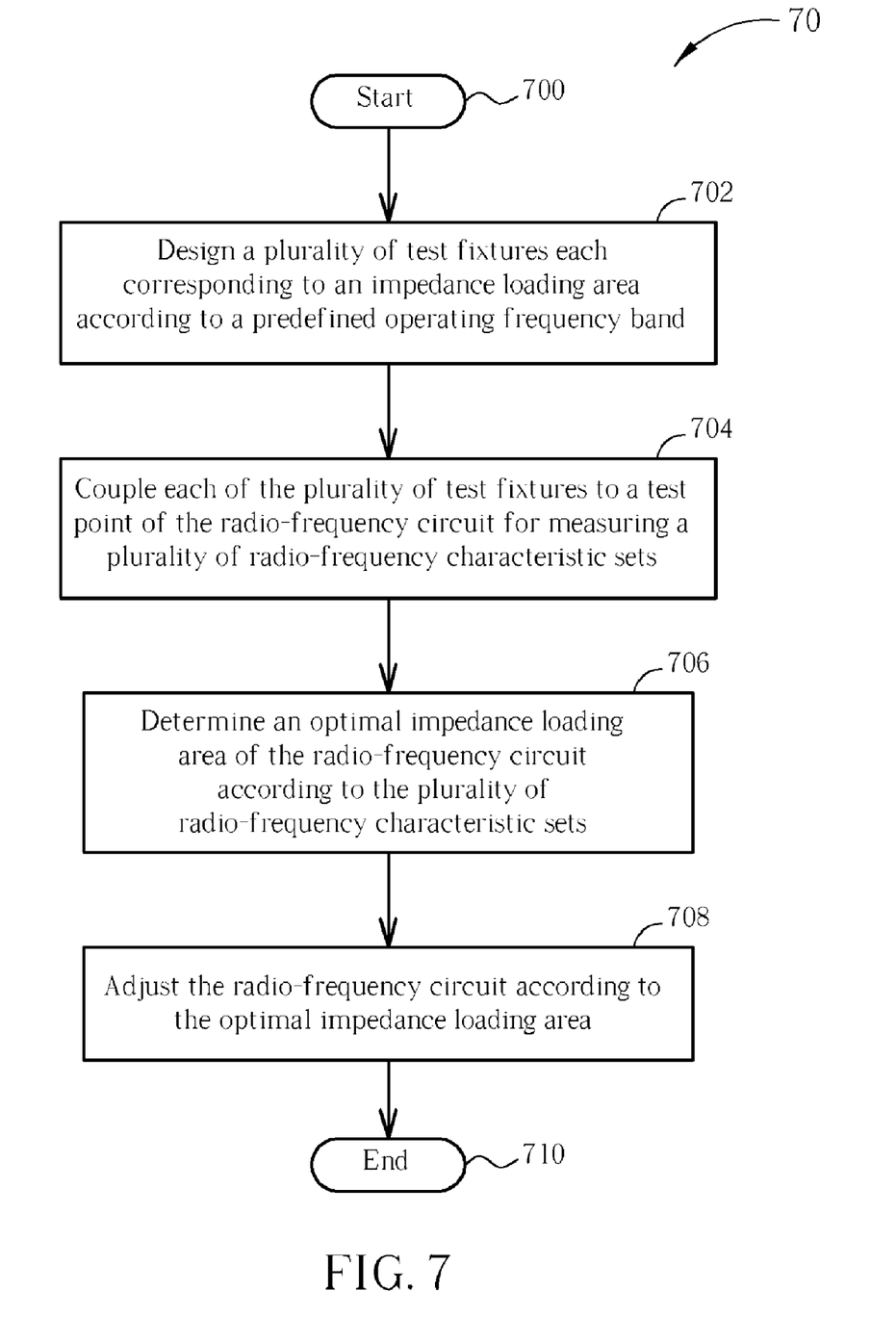
FIG. 7 is a diagram illustrating a process of an embodiment of the present invention.

Please refer to FIG. 7. FIG. 7 is a diagram illustrating a process 70 of an embodiment of the present invention. Process 70 is used for adjusting a radio-frequency circuit by impedance loading features; the radio-frequency circuit may be the radio-frequency circuit 10 as shown in FIG. 1. Process 70 comprises the following steps:

Step 700: Start;
Step 702: Design a plurality of test fixtures each corresponding to an impedance loading area according to a predefined operating frequency band;
Step 704: Couple each of the plurality of test fixtures to a test point of the radio-frequency circuit for measuring a plurality of radio-frequency characteristic sets;
Step 706: Determine an optimal impedance loading area of the radio-frequency circuit according to the plurality of radio-frequency characteristic sets;
Step 708: Adjust the radio-frequency circuit according to the optimal impedance loading area;
Step 710: End.

According to process 70, the present invention designs the test fixtures corresponding to different impedance loading areas according to a predefined operating frequency band. After that, each test fixture is coupled to the test point of the radio-frequency circuit for measuring the plurality of radio-frequency characteristics. Then the present invention determines the optimal impedance loading area of the radio-frequency circuit and adjusts the radio-frequency circuit according to the measured radio-frequency characteristics.

Therefore, after the design of radio-frequency circuit is completed, the designers may obtain the initial transmitting and receiving abilities of the radio-frequency circuit through process 70 for adjustment of the radio-frequency circuit. Because of it, before utilizing the three-dimensional microwave anechoic chamber for estimating TRP and TIS, designers may initially estimate the transmitting and receiving abilities of radio-frequency circuit for adjustment of the radio-frequency circuit to reduce the amount of time and resources needed for designing the radio-frequency circuit.

Figure 8:
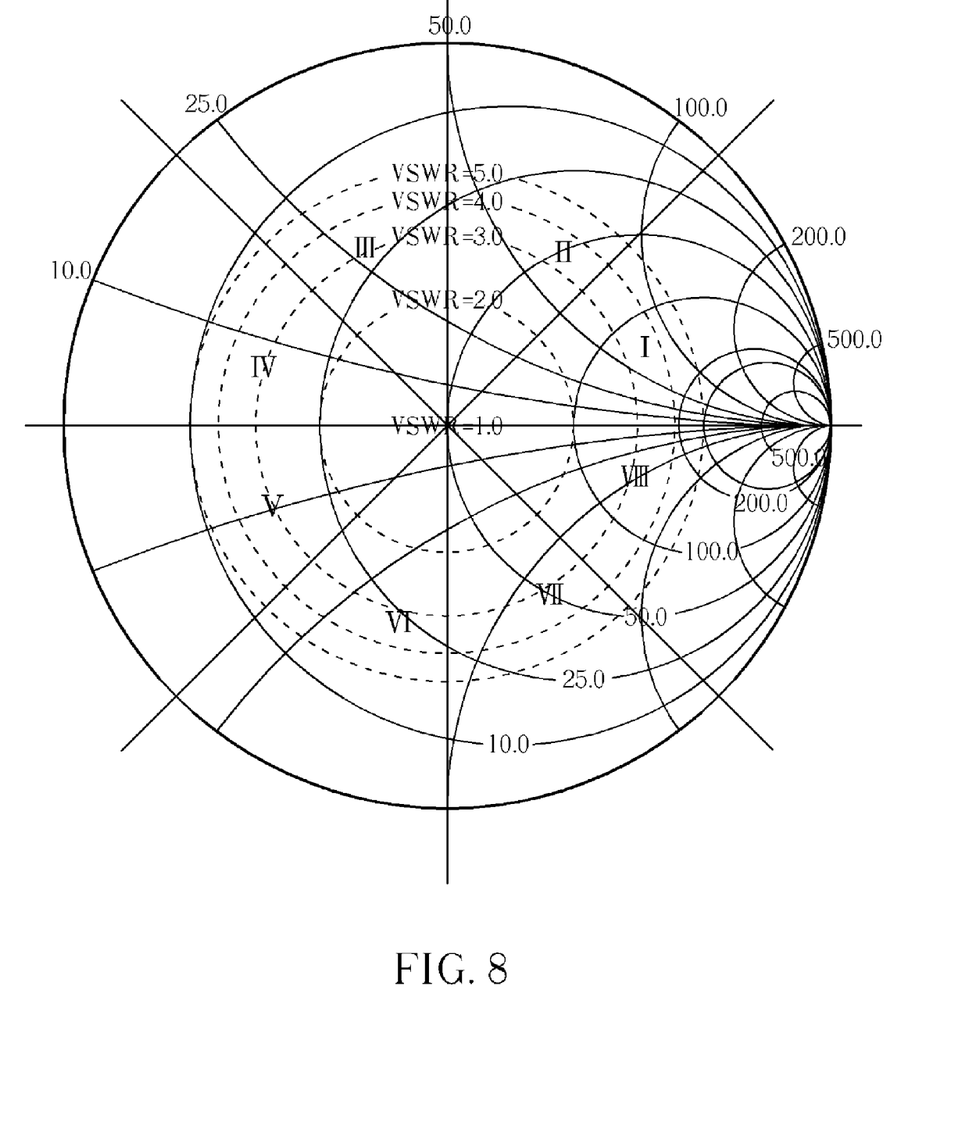
FIG. 8 is a diagram illustrating an impedance loading partition of an embodiment of the present invention.

In process 70 of the present invention, each test fixture is corresponding to an impedance loading area of the predefined operating frequency band, the impedance loading area is used to simulate antenna loading. Thus, when designing each test fixture, its circuit is designed in accordance with the impedance matching and VSWR required. First, please refer to FIG. 8, which is a diagram illustrating impedance loading partitions. In FIG. 8, the Smith Chart is separated into 8 big partitions in accordance with the predefined operating frequency band, in the order of I, II, III, IV, V, VI, VII, VII. Each partition is divided into 5 small partitions in accordance with the circle of VSWR, in the order of VSWR<2, 2<VSWR<3, 2<VSWR<3, 3<VSWR<4, 4<VSWR<5, VSWR>5.

After setting up all impedance loading areas is completed, the corresponding test fixture is designed in accordance with each impedance loading area. Please refer to FIG. 9, which is a diagram illustrating a test fixture 90 of an embodiment of the present invention. Test fixture 90 includes ends 92 and 94 and components Z1 to Z5. Components Z1 to Z5 may include a tunable capacitor, resistor, or inductor to generate different impedance features. While designing test fixture 90, one of the ends 92 or 94 is coupled to the impedance component with 500, and the impedance of test fixture 90 is tested with another end 92 or 94. Capacitance or inductance of the components Z1 to Z5 is adjusted according to the corresponding impedance loading areas so that the impedance of the test fixture 90 will apply to the corresponding impedance loading areas. And so forth, 40 impedance loading test fixtures may be designed in accordance with each operating frequency band as the standard unit for such frequency band.

Figure 9:
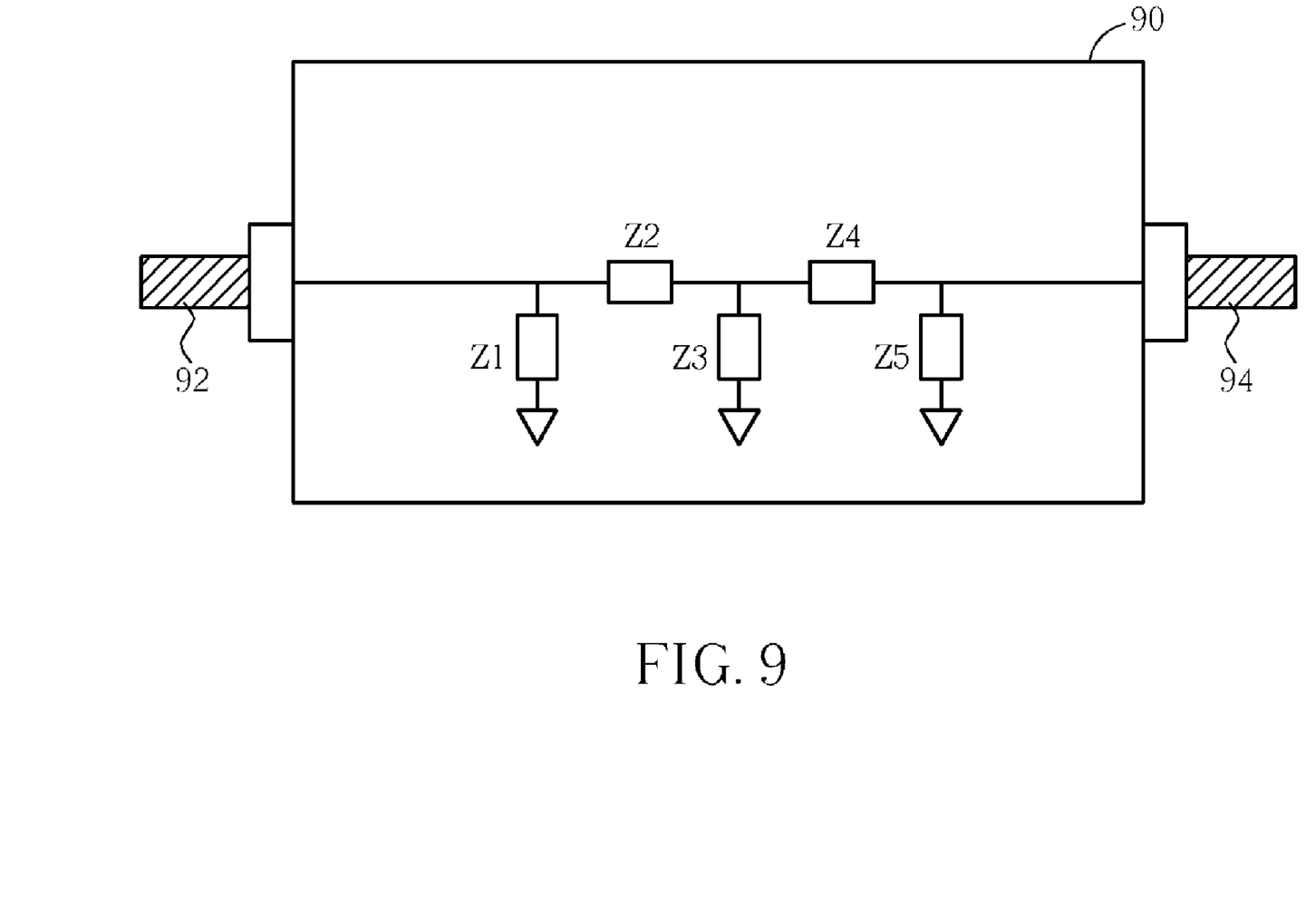
FIG. 9 is a diagram illustrating a test fixture of an embodiment of the present invention.

It is noted that the diagram illustrating the impedance loading partitions as shown in FIG. 8 is used to interpret the present invention, which is, first divide the Smith Chart into M big partitions, then separate each big partition into N small partitions according to VSWR. The sizes of M and N is determined by the designer, the larger the number the more precise the resolution. Similarly, the test fixture 90 in FIG. 9 is only an embodiment of the present invention; the components included may be added or eliminated depending on the needs of the person skilled in the art.

After corresponding the test fixture to each impedance loading area, process 70 is respectively coupled between the test point of the radio-frequency circuit and the test device with an impedance of 50Ω to measure the radio-frequency characteristics of radio-frequency circuit, such as the transmitting power, the receiving sensitivity, and the electrical consumption. Next, the present invention is able to determine the initial optimal efficiency, the corresponding test fixture, and the optimal impedance loading area according to the estimated transmitting power, receiving sensitivity, and electrical consumption. Furthermore, the present invention may roughly estimate TRP and TIS according the corresponding transmitting power, receiving sensitivity, and antenna efficiency to the optimal impedance loading area, for example, set up an initial TRP (dBm as a unit) that equals to the transmitting power of the optimal impedance loading area plus 10 log(N), where N represents antenna efficiency; and set up an initial TIS that equals to the receiving sensitivity of the optimal impedance loading area minus 20 log(N). Therefore, the designer may adjust the antenna of radio-frequency circuit and the antenna matching circuit to conform to the optimal impedance loading area. After adjusting the radio-frequency circuit in accordance with the optimal impedance loading area, preferably the present invention is able to estimate the precise TRP and TIS in the three-dimensional microwave anechoic chamber for designing the radio-frequency circuit required.

Figure 10:
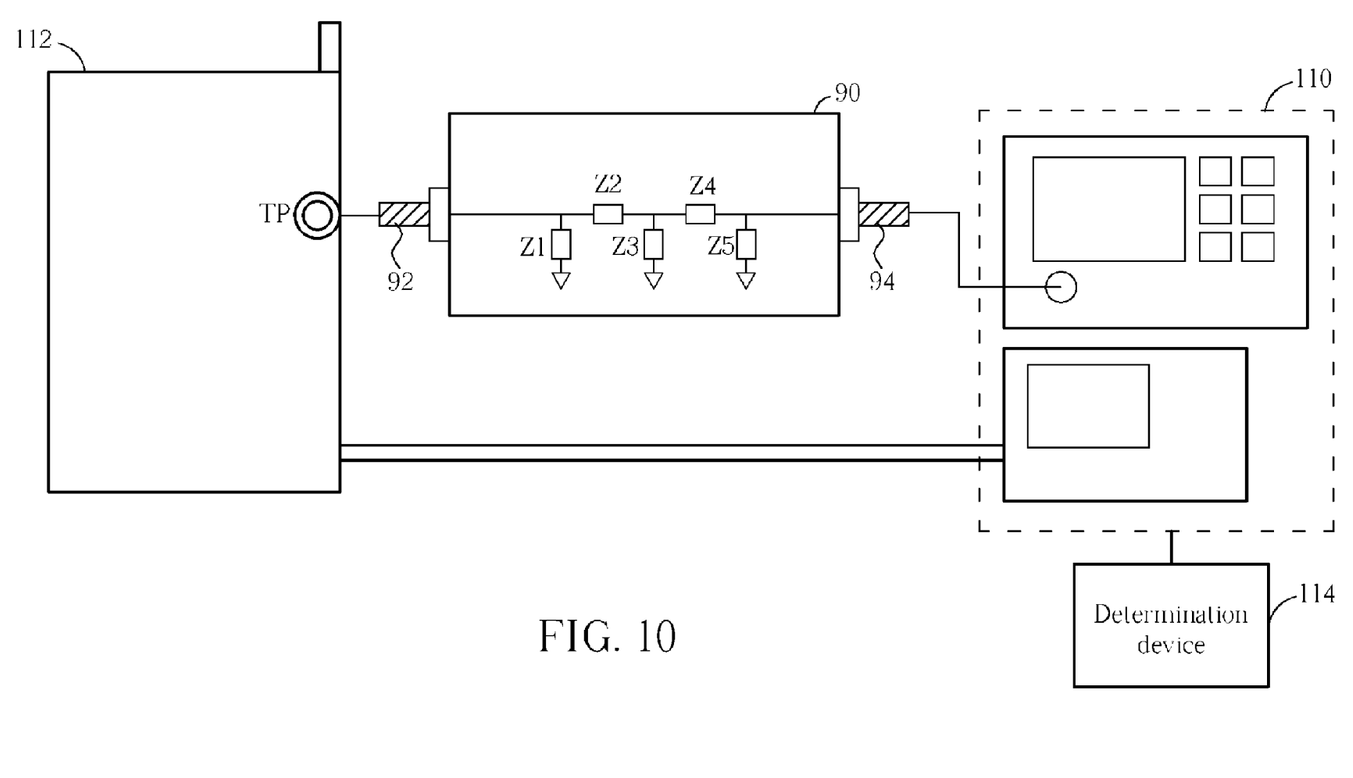
FIG. 10 is a diagram illustrating an embodiment of the present invention testing the wireless communication device.

Please refer to FIG. 10 concerning the method of implementing the process 70. In FIG. 10, as the wireless transmitting and receiving efficiencies of a wireless communication device 112 are to be tested, the test fixture 90 may be coupled between the test point TP of radio-frequency circuit (not shown in FIG. 10) and a test device 110 in the wireless communication device 112 to estimate transmitting power, receiving sensitivity, and electrical consumption by a composite analyzer, a network analyzer, or a power supply. Then the different test fixtures are displaced to estimate the corresponding transmitting power, receiving sensitivity, and electrical consumption. According to the result estimated by test device 110, preferably the present invention may determine the optimal impedance loading area by a determination device 114 to provide a basis for adjustment of radio-frequency circuit, such as adjusting the antenna of radio-frequency circuit or the antenna matching circuit. Other than that, after determining the optimal impedance loading area, preferably the present invention may estimate the initial TRP and the initial TIS by an estimation device (not shown in FIG. 10) according to the corresponding transmitting power to the optimal impedance loading area; or estimate the precise TRP and TIS in the three-dimensional microwave anechoic chamber for adjustment of the radio-frequency circuit.

Thus after the design of the radio-frequency circuit is completed through the present invention, the designer may obtain the initial transmitting and receiving abilities of radio-frequency circuit for adjustment of the radio-frequency circuit, so that before entering the three-dimensional microwave anechoic chamber to estimate TRP and TIS, the designer may initially estimate the transmitting and receiving abilities of the radio-frequency circuit for adjustment of the radio-frequency circuit to reduce the amount of time and resources needed for designing the radio-frequency circuit.

Those skilled in the art will readily observe that numerous modifications and alterations of the device and method may be made while retaining the teachings of the invention.

What is claimed is:

1. A method for adjusting a radio-frequency circuit by impedance loading features, comprising:
   designing a plurality of test fixtures each corresponding to an impedance loading area according to a predefined operating frequency band;
   coupling each of the plurality of test fixtures to a test point of the radio-frequency circuit for measuring a plurality of radio-frequency characteristic sets;
   determining an optimal impedance loading area of the radio-frequency circuit according to the plurality of radio-frequency characteristic sets; and
   adjusting the radio-frequency circuit according to the optimal impedance loading area.

2. The method of claim 1, wherein the plurality of text fixtures are designed according to an impedance matching and a voltage standing wave ratio (VSWR) corresponding to the predefined operating frequency band.

3. The method of claim 1, wherein each of the plurality of radio-frequency characteristic sets comprises a transmitting power, a receiving sensitivity, and an electrical consumption.

4. The method of claim 3, wherein a plurality of the radio-frequency characteristic sets are measured by the plurality of test fixtures using a test device, and an impedance of the test device is 50Ω.

5. The method of claim 4, wherein the test device is coupled to a test point of the radio-frequency circuit through one of the plurality of test fixtures for measuring the plurality of radio-frequency characteristic sets.

6. The method of claim 1, wherein determining the optimal impedance loading area of the radio-frequency circuit according to the plurality of radio-frequency characteristic sets comprises:
   choosing one of the plurality of the radio-frequency characteristic sets as an optimal radio-frequency characteristic; and
   determining the optimal impedance loading area of the radio-frequency circuit according to a test fixture corresponding to the optimal radio-frequency characteristic.

7. The method of claim 6, wherein an antenna and an antenna matching circuit of the radio-frequency circuit are adjusted according to the optimal impedance loading area.

8. The method of claim 1 further comprising estimating a total radiated power (TRP) and a total isotropic sensitivity of the radio-frequency circuit.

9. The method of claim 8, wherein estimating the total radiated power and the total isotropic sensitivity of the radio-frequency circuit is estimating the total radiated power and the total isotropic sensitivity of the radio-frequency circuit according to a radio-frequency characteristic corresponding to the optimal impedance loading area and antenna efficiency of an antenna of the radio-frequency circuit.

10. The method of claim 9, wherein the total radiated power and the total isotropic sensitivity of the radio-frequency circuit are estimated in a three-dimensional microwave anechoic chamber.

11. The method of claim 10, further comprising adjusting the radio-frequency circuit according to the total radiated power and the total isotropic sensitivity.

12. An electronic device for adjustment of a radio-frequency circuit by impedance loading features, comprising:
   a plurality of test fixtures each corresponding to an impedance loading area of a predefined operating frequency band;

a test device coupled to a test point of the radio-frequency circuit through one of the plurality of test fixtures for measuring a plurality of radio-frequency characteristic sets of the radio frequency circuit by the plurality of test fixtures; and a determination device coupled to the test device for determining an optimal impedance loading area of the radio-frequency circuit according to the plurality of the radio-frequency characteristic sets in order to provide a basis for adjustment of the radio-frequency circuit.

13. The electronic device of claim 12, wherein each of the plurality of test fixtures is designed according to an impedance matching and the VSWR corresponding to predefined operating frequency band.

14. The electronic device of claim 12, wherein each of the plurality of radio-frequency characteristic sets has a transmitting power, a receiving sensitivity, and an electrical consumption.

15. The electronic device of claim 12, wherein an impedance of the test device is 50Ω.

16. The electronic device of claim 15, wherein the test device comprises a composite analyzer and a network analyzer.

17. The electronic device of claim 16, wherein the test device further includes a power supply.

18. The electronic device of claim 12, wherein the determination device is used to choose an optimal radio-frequency characteristic from the plurality of radio-frequency characteristic sets, and the optimal impedance loading area of the radio-frequency circuit is determined according to a test fixture corresponding to the optimal frequency characteristic.

19. The electronic device of claim 12, wherein the determination device is used to provide a basis for adjustment of an antenna and an antenna matching circuit of the radio-frequency circuit.

20. The electronic device of claim 12 further comprising an estimation device coupled to the determination device for estimating a total radiated power and a total isotropic sensitivity of the radio-frequency circuit.

21. The electronic device of claim 20, wherein the estimation device roughly estimates the total radiated power and the total isotropic sensitivity according to a radio-frequency characteristic of the optimal impedance loading area and antenna efficiency corresponding to an antenna of the radio-frequency circuit.

22. The electronic device of claim 21, wherein the estimation device estimates the total radiated power and the total isotropic sensitivity of the radio-frequency circuit in a three-dimensional microwave anechoic chamber.

* * * * *

UNITED STATES PATENT AND TRADEMARK OFFICE
CERTIFICATE OF CORRECTION

PATENT NO.        : 8,019,307 B2
APPLICATION NO.   : 12/049381
DATED             : September 13, 2011
INVENTOR(S)       : Yung-Jinn Chen It is certified that error appears in the above-identified patent and that said Letters Patent is hereby corrected as shown below:

On the title page, item (73), the name of the assignee "Winstron NeWeb Corporation" should read --Wistron NeWeb Corporation--.

Signed and Sealed this
Eighth Day of November, 2011

David J. Kappos
*Director of the United States Patent and Trademark Office*